United States Patent [19]

Fukase et al.

[11] Patent Number: 5,578,524
[45] Date of Patent: Nov. 26, 1996

[54] FABRICATION PROCESS OF A SEMICONDUCTOR DEVICE WITH A WIRING STRUCTURE

[75] Inventors: Tadashi Fukase; Takehiko Hamada, both of Tokyo, Japan

[73] Assignee: NEC Corporation, Tokyo, Japan

[21] Appl. No.: 413,868

[22] Filed: Mar. 29, 1995

[30]    Foreign Application Priority Data

Mar. 30, 1994 [JP] Japan ..................... 6-061734

[51] Int. Cl.$^6$ .................. H01L 21/283; H01L 21/31
[52] U.S. Cl. .................. 437/195; 437/228; 437/238; 437/978
[58] Field of Search ............. 437/195, 228, 437/238, 978, 984, 228 ES, 50; 156/644.1, 653.1; 257/758, 760

[56]    References Cited

U.S. PATENT DOCUMENTS

| | | | |
|---|---|---|---|
| 5,037,777 | 8/1991 | Mele et al. ............ | 437/195 |
| 5,206,187 | 4/1993 | Doan et al. ............ | 437/192 |
| 5,252,515 | 10/1993 | Tsai et al. ............ | 437/195 |
| 5,378,318 | 1/1995 | Weling et al. ........... | 156/662 |
| 5,382,545 | 1/1995 | Hong ................... | 437/195 |

FOREIGN PATENT DOCUMENTS

| | | |
|---|---|---|
| 0265584 | 5/1988 | European Pat. Off. . |
| 321030 | 1/1991 | Japan . |

*Primary Examiner*—T. N. Quach
*Attorney, Agent, or Firm*—Whitham, Curtis, Whitham & McGinn

[57]    ABSTRACT

An intermediate insulation layer provided between a wiring of gate electrodes on a semiconductor substrate and a wiring formed in an upper layer includes a first interlayer insulation layer, a silicon rich oxide layer stacked on the first interlayer insulation layer and containing excessive silicon atom, and a second interlayer insulation layer stacked over the silicon rich oxide layer. Processes are provided for selectively performing dry etching for the insulation layers in order to simultaneously and easily form a self-aligned type contact hole on the diffusion layer position at the gap between oppositely arranged gate electrodes and a contact hole on the wiring of the predetermined gate electrode. In this manner, on the diffusion layer and the wiring of the gate electrode, the self-align contact hole and the contact hole are formed in the same process. This permits elimination of the need for margins in formation of the contact hole in the semiconductor device adapted for ultra-high packing density.

20 Claims, 9 Drawing Sheets

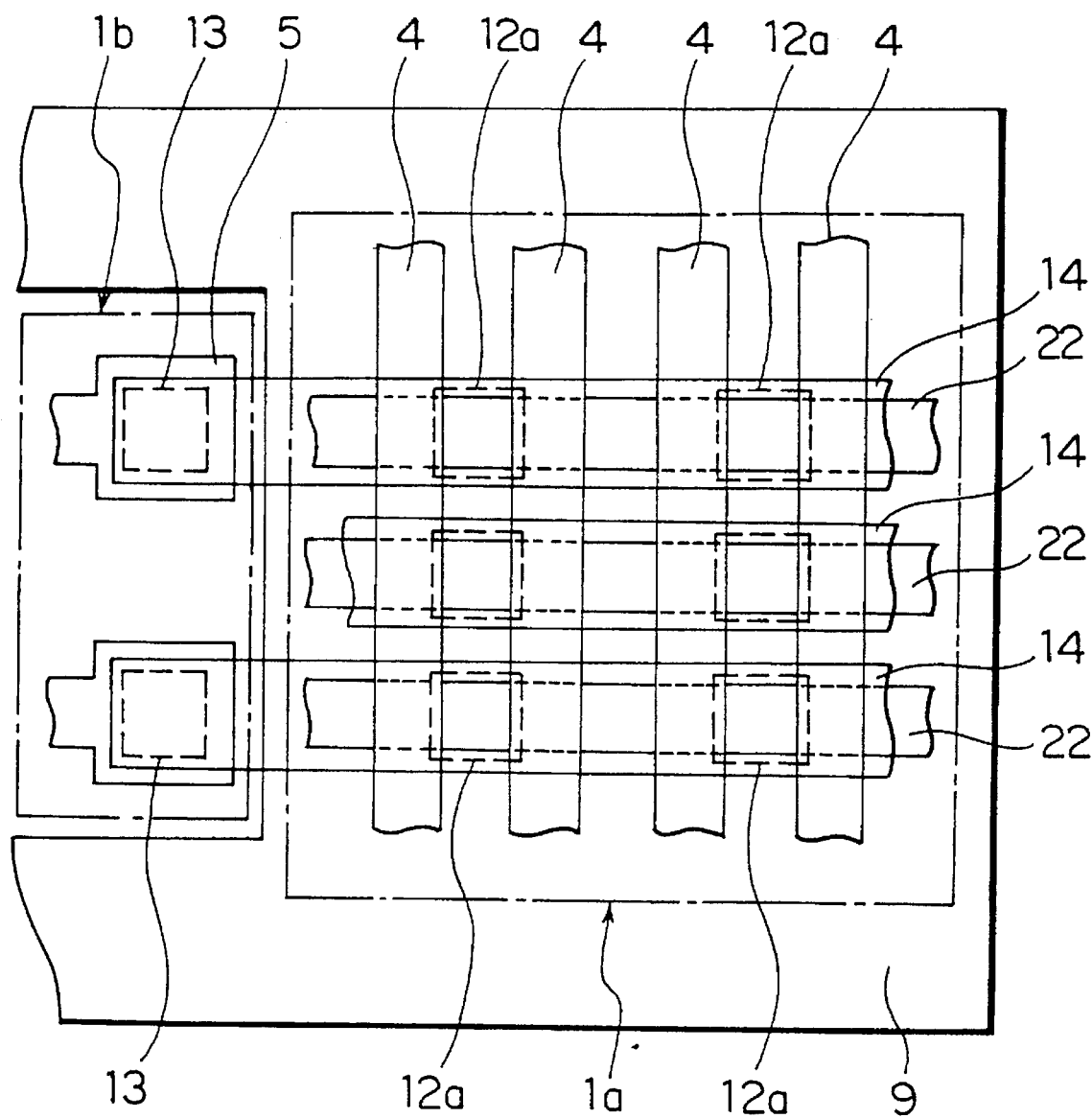

_5,578,524_

FABRICATION PROCESS OF A SEMICONDUCTOR DEVICE WITH A WIRING STRUCTURE

BACKGROUND OF THE INVENTION

1. Field of the Invention

The present invention relates generally to a fabrication process of a semiconductor device with a wiring structure. More specifically, the invention relates to an improvement of a structure of a contact hole for electrode wiring and formation process therefor.

2. Description of the Related Art

Down-sizing and higher density packaging of semiconductor elements is still actively on-going. Nowadays, an ultra-high package density semiconductor device, such as 256 Mbits DRAM (dynamic random access memory) designed under 0.25 μm of dimensional standard has been developed and experimentally fabricated. Associated with increasing packing density of the semiconductor devices, a strong demand is growing for reduction or elimination of margin for mask alignment in lithography process which is essential process in fabrication of semiconductor element structures.

Normally, in fabrication of the semiconductor devices, semiconductor elements of fine structures are formed by sequentially stacking patterns of various materials, such as metal film, semiconductor film, insulation layer and so forth. Upon stacking patterns for semiconductor elements, in lithography process, it is required to align a mask to a lower layer pattern formed in the preceding process and to subsequently form a upper layer pattern. However, in the lithography process, it is possible to cause position error between the upper layer and the lower layer. Therefore, it becomes necessary to provide a margin of tolerance in an interval of the pattern on the mask by taking such position error into account. However, such a margin inherently borders increasing of package density.

Therefore, study has been started for marginless technology to make such a margin in the interval of the pattern unnecessary. It is particularly important to make formation of a contact hole marginless. The contact hole is frequently formed through various layers on a semiconductor substrate, a semiconductor layer and a metal layer. To make formation of the contact hole marginless represents the most effective technique for increasing of package density of the semiconductor device. One dominant method for marginless technology is a self-aligned type contact hole formation process. Various concrete methods in this regard have been studied. For example, Japanese Unexamined Patent Publication (Kokai) No. Heisei 3-21030 shows one example of such methods.

FIGS. 1A to 1D are cross sections showing a sequence of process steps for forming a self-aligned type contact hole on the semiconductor substrate disclosed in the above-identified Japanese Unexamined Patent Publication No. Heisei 3-21030.

As shown in FIG. 1A, a plurality of insulated-gate type field effect transistors are provided on the surface of a silicon semiconductor substrate 41. In these insulated-gate type field effect transistors, circumferences of the adjacent gate electrodes 42 and 42a are coated with coating oxide layer 43 and 43a. Also, the overall surface of the semiconductor substrate 41, on which are formed a diffusion layer 44 to be the sources and drains of the insulated-gate type field effect transistors and an isolation oxide layer 45, is coated by an etch buffer insulation layer 46. Here, the coating oxide layer 43 and 43a and the etch buffer insulation layer 46 are formed with silicon oxide layers and silicon nitride layer, respectively.

Next, after forming insulation layer 47 with a silicon oxide layer including a boron glass or phosphorous glass (hereinafter referred to as "BPSG layer"), selective etching of the interlayer insulation layer 47 is performed with a photoresist 48 as a mask. This etch is a wet etching with a fluoric acid type chemical liquid. The etching buffer insulation layer 46 is formed with the silicon nitride layer having etching resistance against fluoric acid. Therefore, etching of this insulation layer is not substantial in extent. Then, only interlayer insulation layer 47 is etched to form a diffusion layer contact hole 49 being formed.

Next, as shown in FIG. 1C, the portion of the etch buffer insulation layer 46 not covered by the insulation layer 47 is selectively etched for removal. In this case, in order to avoid progress of etching in the coating oxide layer 43 and 43a, the etching has to be performed under a dry etching condition. Thus, the diffusion layer contact hole 49a exposing the diffusion layer 44 on the surface is formed.

Finally, as shown in FIG. 1D, a wiring layer 50 is formed. As shown in FIG. 1D, the diffusion layer contact hole 49a on the semiconductor substrate is formed in a self-aligned manner in the gate electrodes 42 and 42a coated with coating oxide layers 43 and 43a. Thus, via the diffusion layer contact hole 49a, the wiring layer 50 is electrically connected to the diffusion layer 44 and is insulated from the gate electrodes 42 and 42a via the coating insulation layer 43 and 43a.

The above-mentioned wiring structure formation method is the formation method for a self-aligned type contact hole for connection of the impurity diffusion layer 44 formed on the silicon semiconductor substrate 41 and the upper wiring layer 50. However, in the normal semiconductor device, the gate electrode is formed as wiring. Thus, it is essential that the wiring of the gate electrode and the upper layer wiring are electrically connected. In order to satisfy such requirement with the above-mentioned prior art, it becomes necessary to have a contact hole formation process performed separately from the self-aligned type contact hole formation process. Therefore, it is desired in view point of shortening of the process to form the contact hole on the wiring of the gate electrode simultaneously with formation of the self-aligned type contact hole.

Furthermore, when the silicon nitride layer is employed as the etching buffer insulation layer 46 as in the prior art shown in FIGS. 1A to 1D, electrification of charge in the insulation layer below the wiring 50 can be caused. This is because that charge may be accumulated at the interface between the coating oxide layers 43, 43a and the etching buffer layer 46, the interface between the interlayer insulation layer and the etching buffer insulation layer and so forth. The electrifying of charge in the insulation layer will degrade reliability of the semiconductor device. Such electrifying is caused by virtue of the same principle as attributable to accumulation of charge in the interface of the oxide layer and nitride layer in the MNOS (metal-nitride layer-oxide layer-semiconductor) as non-volatile memory device.

Also, since the silicon nitride layer is not permeable to hydrogen, difficulty is encountered in hydrogen alloying of the semiconductor device. Hydrogen alloying is performed after completion of metallization as final process in fabrication of the semiconductor device to make the interface between the silicon oxide layer and the silicon semiconductor substrate electrically inactive for stabilization. If this process cannot be performed, a threshold voltage of a insulated-gate type field effect transistor is unstable. Also, junction leak current at the interface region of the diffusion layer 44 and the isolation oxide layer 45 can be increased. Increase of the leak current is critical for increasing packing density of the semiconductor device. Therefore, solution of this problem is imperative.

In addition, the silicon nitride layer may cause large thermal stress to the silicon semiconductor substrate. Consequently, in the thermal process in the semiconductor device fabrication process, a crystal defect may be caused in the silicon semiconductor substrate. Such an inductive defect is caused at a certain rate to lower the yield in the semiconductor device fabrication process.

SUMMARY OF THE INVENTION

It is an object of the present invention to provide a fabrication process of a semiconductor device with a wiring structure and contact hole which permits stable formation of a self-aligned type contact hole on a diffusion layer and also on the wiring of a gate electrode.

Another object of the invention is to have a wiring structure which can be adapted to enhance ultra high packing density and thus enable employment of a marginless technology in formation of the contact hole.

For this purpose, the present invention forms a plurality of insulation layers described below in an intermediate insulation layer between a wiring of gate electrodes arranged on a semiconductor substrate and a wiring at an upper layer thereof. Namely, a first intermediate insulation layer is formed covering the gate electrodes, a silicon rich oxide is formed stacking on the first intermediate insulation layer, and thereafter, a second intermediate insulation layer is formed stacking on the silicon rich oxide layer. Thereafter, the contact holes are formed on the diffusion layer positioned at a gap between adjacent gate electrodes and on the predetermined gate electrode.

The formation process of the self-aligned contact hole on the diffusion layer includes a process for performing etching for the second intermediate insulation layer, and a process for removing the silicon rich oxide layer by etching. In addition, etching is performed by dry etching selective to the material to be etched. The lower portion of the contact hole is defined by the adjacent gate electrodes arranged in opposition and is covered at the circumference with the first intermediate insulation layer.

After preliminarily removing the silicon rich oxide layer on the predetermined gate electrode, the second intermediate insulation layer is formed. Subsequently, dry etching is performed selectively for the intermediate insulation layers to form the contact holes on the diffusion layer and on the wiring of the gate electrode.

It should be noted that the content of the silicon atoms to be contained in the silicon rich oxide layer is preferred to be greater than or equal to 35 at % to less than or equal to 45 at %.

As set forth above, since the predetermined invention can form the contact holes on the diffusion layer on the surface of the semiconductor substrate and the wiring of the gate electrode through a simple process by covering only the region where the gate electrodes are arranged in an adjacent mutually opposing relationship in the wiring of the gate electrode of the insulated-gate type transistor except for the predetermined region of the wiring of the gate electrode. Furthermore, the thermal property of the insulation layer of the silicon rich oxide is quite close to that of silicon dioxide. All of the problems in the prior art which employs the silicon nitride as the etch buffer insulation layer, can be solved. Also, stability of the semiconductor device by hydrogen alloying can be attained. Also, by lowering of stress in the intermediate insulation layer, crystal defects can be significantly reduced. Thus, the present invention facilitates formation of a marginless contact hole with a simplified process and with high reliability.

BRIEF DESCRIPTION OF THE DRAWINGS

The present invention will be understood more fully from the detailed description given herebelow and from the accompanying drawings of the preferred embodiment of the invention, which, however, should not be taken to be limitative to the present invention, but are for explanation and understanding only.

In the drawings:

FIG. 3 is a plan view showing a semiconductor device at the intermediate process in the first embodiment;

DESCRIPTION OF THE PREFERRED EMBODIMENT

Next, the preferred embodiment of the present invention will be discussed with reference to the accompanying drawings. In the following description, numerous specific details are set forth in order to provide a thorough understanding of the present invention. It will be obvious, however, to those skilled in the art that the present invention may be practiced without these specific details. In other instance, well-known structures are not shown in detail in order to unnecessary obscure the present invention.

FIGS. 2A to 2F are cross sections showing a semiconductor device fabrication process according to the first embodiment of the invention. FIG. 3 is a plan view of the semiconductor device.

Figure 1A:
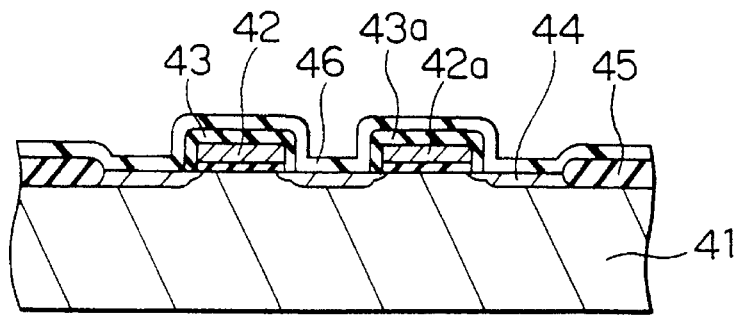
FIGS. 1A to 1D are cross sections showing a conventional semiconductor device fabrication process.
Figure 1B:
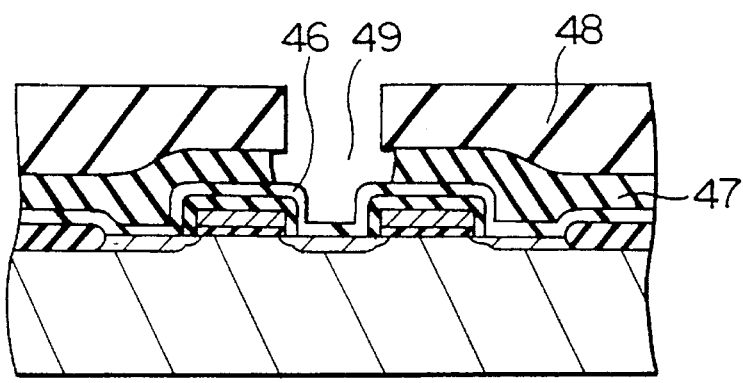
Figure 1C:
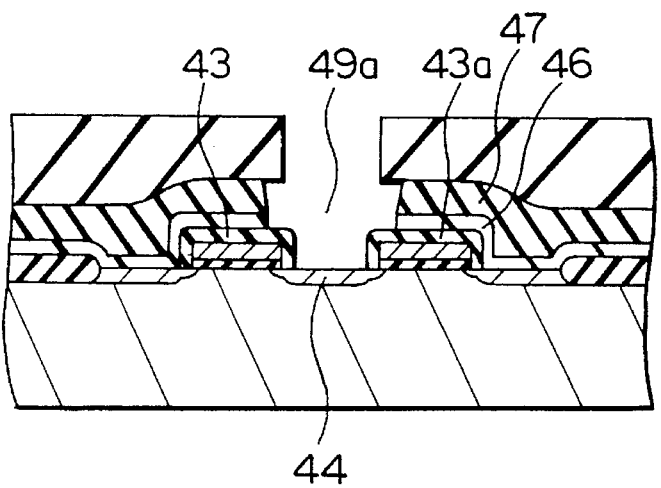
Figure 1D:
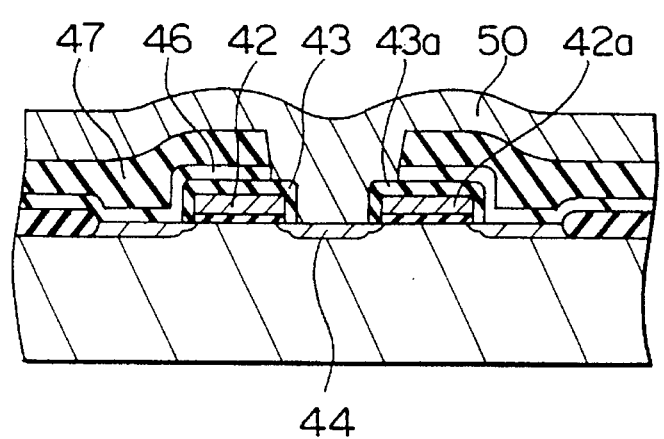
Figure 2A:
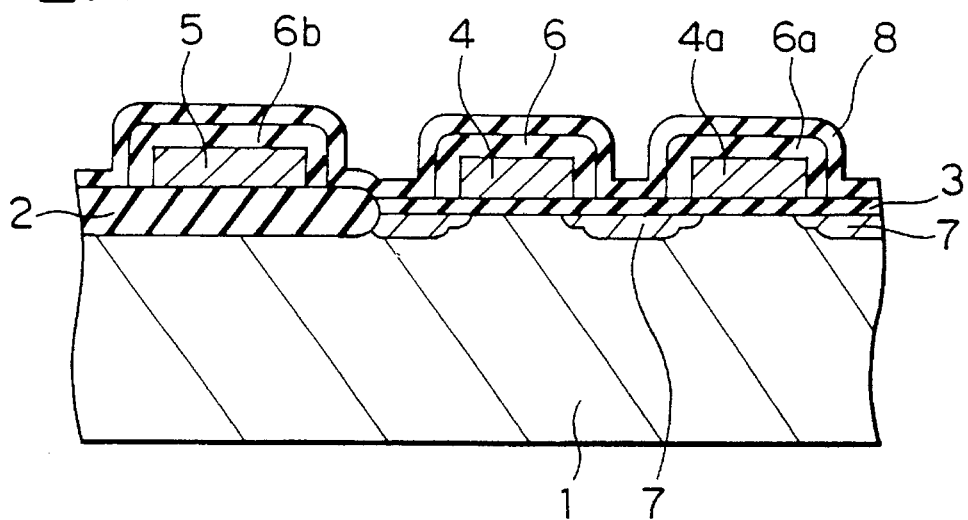
FIGS. 2A to 2F are cross sections showing a semiconductor device fabrication process according to the first embodiment of the present invention.
Figure 2B:
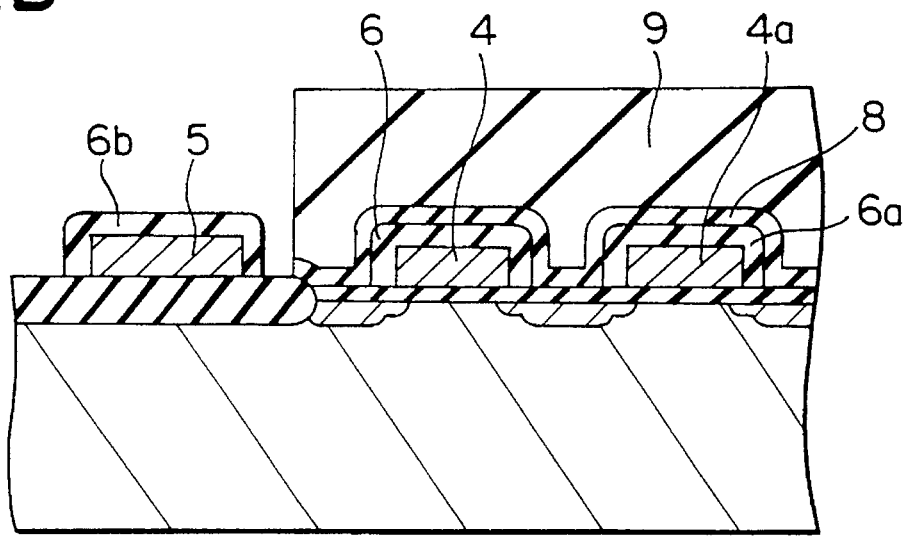

As shown in FIG. 2A, a plurality of insulated-gate type field effect transistors are formed on the surface of a silicon semiconductor substrate. In conjunction therewith, a first wiring layer 5 formed in the same layer and the same material with gate electrodes 4, 4a of the insulated-gate type field effect transistors to form wiring of the gate electrodes over an isolation oxide layer 2.

Hereinafter, discussion will be given for the fabrication process. The isolation oxide layer 2 is formed in a partial region of a semiconductor substrate 1 which has a conductive type of p-type and specific resistance of 1 to 10Ω·cm. Thereafter, a thin oxide layer 3 formed with layer thickness of 5 to 15 nm of silicon dioxide layer and having a portion to be located beneath the gate electrodes 4 and 4a to serve as gate insulation layer, is formed. Then, the gate electrodes 4 and 4a and the first layer wiring 5 are formed over the thin oxide layer 3 and the isolation oxide layer. The gate electrodes 4 and 4a and the first wiring layer 5 are formed with a laminate structure of 10 to 100 nm thickness of a polycrystalline silicon layer containing n-type or p-type impurity, and 100 to 200 nm thickness of a tungsten silicide layer or titanium silicide layer.

Next, first intermediate insulation layers 6, 6a and 6b respectively covering the circumferences of the gate electrodes 4, 4a and the first wiring layer 5 are formed with a silicon dioxide layer having layer thickness of 50 to 200 nm. Thereafter, an $n^+$ diffusion layer to be source and drain regions of the insulated-gate type field effect transistor is formed.

Then, over the entire surface of the semiconductor substrate 1, namely with covering of the first interlayer insulation layers 6, 6a and 6b, the isolation oxide layer 2 and the thin oxide layer 3, an etch buffer insulation layer 8 is deposited. The etch buffer insulation layer 8 is an approximately 100 nm thick layer formed of a silicon oxide layer containing excessive silicon, which layer will be hereinafter referred to as silicon-rich oxide (SRO) layer.

Here, the method for forming the SRO layer will be discussed briefly. The method for forming this layer is essentially the same as a method for forming the silicon dioxide layer by a chemical vapor deposition (CVD) method. Namely, in a LPCVD oven having a quartz reaction tube which can introduce a vacuum and a heater for heating the reaction tube, with setting the oven temperature at 700° C. to 800° C., monosilane and nitrogen monoxide gases are introduced into the oven through mutually different gas inlets. Nitrogen gas is used as atmosphere gas. Overall pressure of these gases is adjusted to be about 1 Torr. In this layer formation process, an excessive amount of silicon is provided in the silicon dioxide layer. For this purpose, the gas flow ratio of the monosilane and nitrogen monoxide is varied to increase the gas flow rate of monosilane. According to increasing of the proportion of the monosilane, the amount of the excessive silicon is increased. Thus, the thin layer of silicon oxide containing excessive silicon, namely an SRO layer can be formed. This SRO layer is an insulator having a structure, in which fine silicon aggregate is mixed in the silicon dioxide ($SiO_2$) layer.

It should be noted that the layer thicknesses of the first intermediate insulation layer 6 and 6a and insert buffer insulation layer 8 has to be selected so as not to completely fill a gap between the gate electrodes 4 and 4a.

Then, with taking a photoresist 9 as mask, etching is performed to remove only the insert buffer insulation layer covering the region of the first wiring layer 5. In this case, the pattern dimension of the photoresist serving as the mask for etching can be large.

The reason will be discussed with reference to the plan view in FIG. 3. It should be noted that FIG. 3 shows an example, in which four insulated-gate type field effect transistors connected in series are stacked into three layers. Four rows of gate electrodes forming the shown embodiment of the insulated-gate type field effect transistors and three columns of active regions 22 formed of $n^+$ diffusion layer or later mentioned second layer wiring 14 are arranged perpendicularly to each other. As show in FIG. 3, the photoresist 9 covers the region 1a where a plurality of insulated-gate type field effect transistors are arranged, and exposes the region 1b where a plurality of first layer wiring 5 are arranged. The pattern dimension of the photoresist 9 becomes several times of a design standard. Therefore, a fine pattern becomes unnecessary.

Figure 2C:
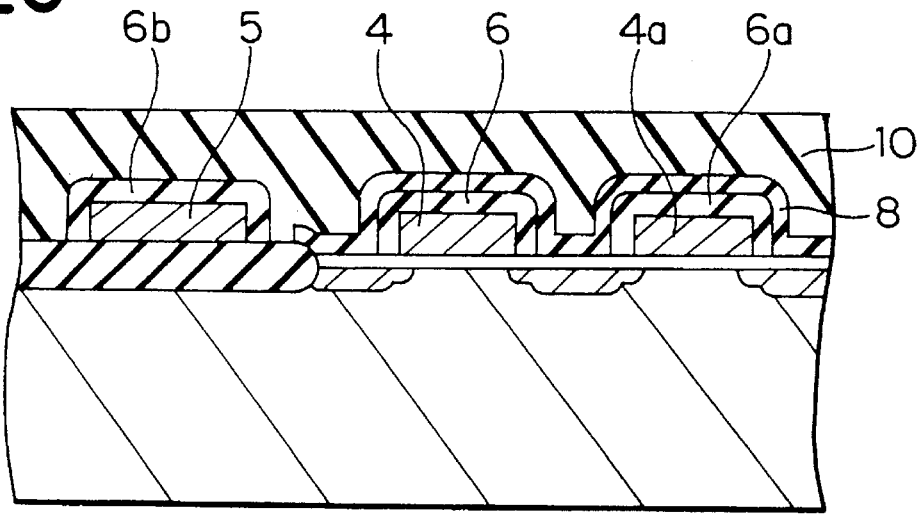

Next, after removing the photoresist 9, a second intermediate insulation layer 10 is deposited to have a layer thickness about 200 to 500 nm by way of a known thermal CVD method, as shown in FIG. 2C. The second intermediate insulation layer 10 is a non-doped silicon dioxide layer or BPSG layer. Also, flattening of this layer is performed by chemical mechanical polishing method or reflow by thermal process.

Figure 2D:
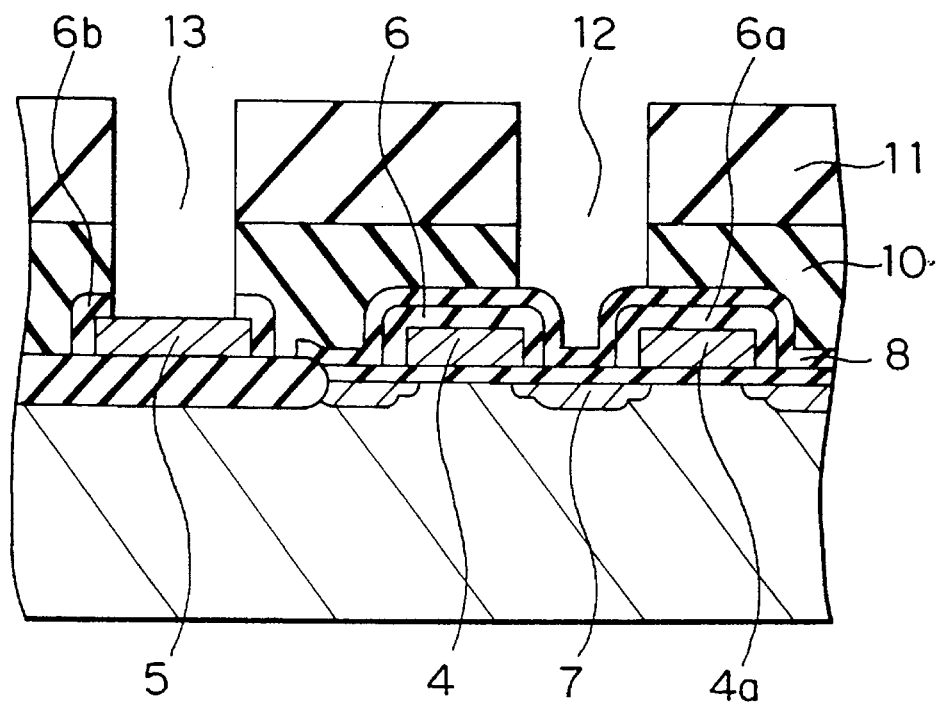

Subsequently, as shown in FIG. 2D, the photoresist 11 for contact is patterned in the known method. Using patterned photoresist 11, dry etching is performed for the second intermediate insulation layer 10. By this etching, a diffusion layer contact hole 12 on the $n^+$ diffusion layer 7 between opposing gate electrodes 4 and 4a and a wiring contact hole 13 on the first intermediate insulation layer are formed. In the dry etching, the first insulation layer 6b and the second intermediate insulation layer 10 are selectively etched. Therefore, a etching condition is selected to have a high etching rate for silicon dioxide layer as the material for forming the first intermediate insulation layer 6b and the second intermediate insulation layer 10 and to have a low etching rate for SRO layer as the material for forming the etch buffer insulation layer 8. Thus, the first intermediate insulation layer 6, 6a and thin oxide layer 3 are protected from the dry etching.

Here, discussion will be given for the dry etching condition with reference to FIG. 4. As a dry etching device, a magnetron type device is typically employed. The frequency of the high frequency power source of the device in this case, is 13.56 MHz which is normally used. Also, as a reaction gas, a mixture gas of $C_4F_8$ and CO gas is introduced.

Figure 4:
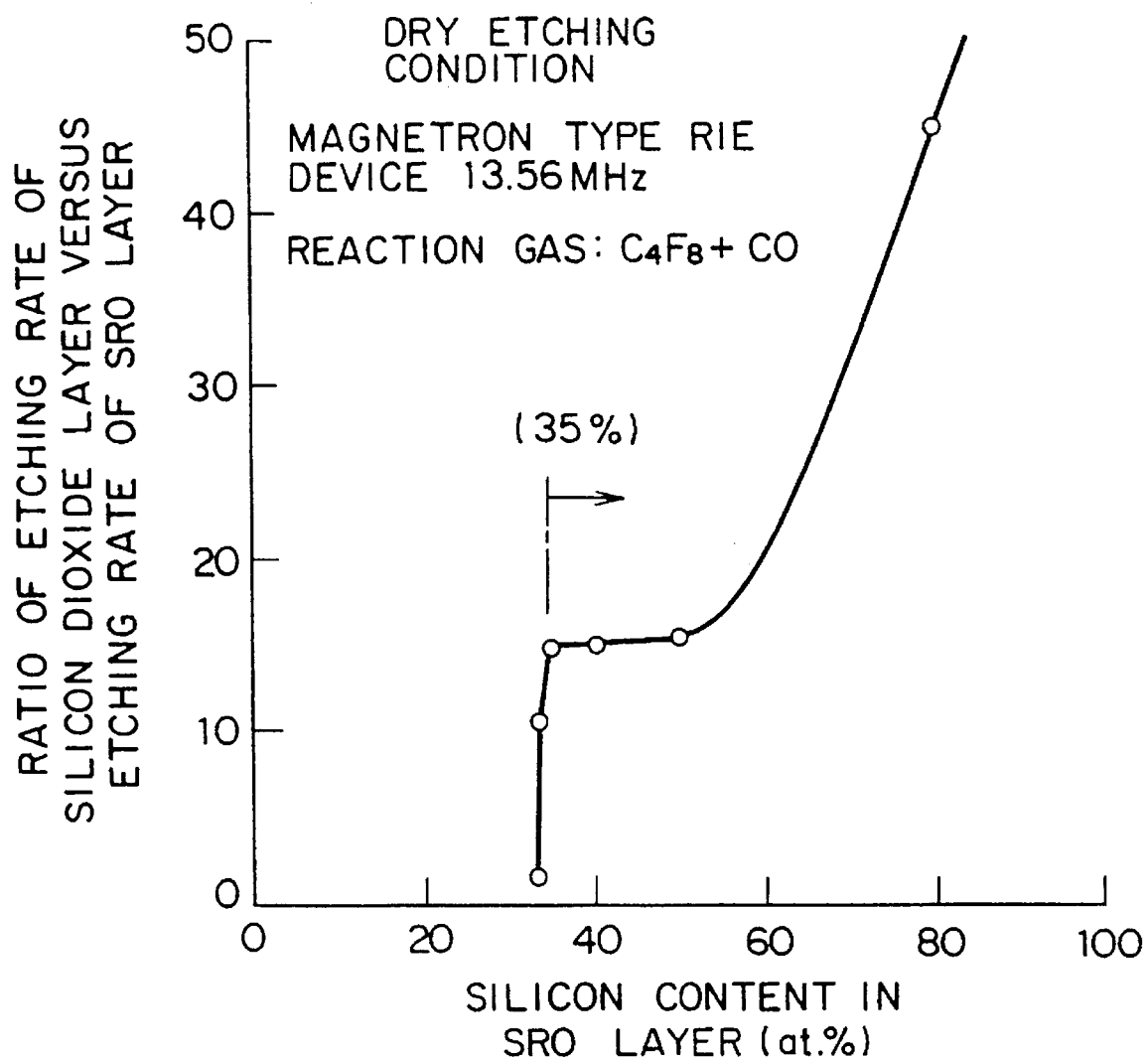
FIG. 4 is a graph showing dry etching characteristics of an SRO layer to be employed in the shown embodiment.

FIG. 4 is a graph showing a relationship between a ratio of the etching rate of silicon dioxide layer versus the etching rate of SRO layer and silicon content in the SRO layer. As shown in FIG. 4, when silicon content in the SRO layer becomes greater than or equal to 35%, the ratio of the etching rate becomes greater than or equal to 15. Here, the silicon content in the silicon dioxide layer is approximately 33.3%. This means that if the silicon content is excessive in the extent of 2% in comparison with silicon dioxide layer, such SRO layer contains 35 at % of silicon and can be used etch buffer insulation layer. Therefore, dry etching is performed in such condition.

Figure 2E:
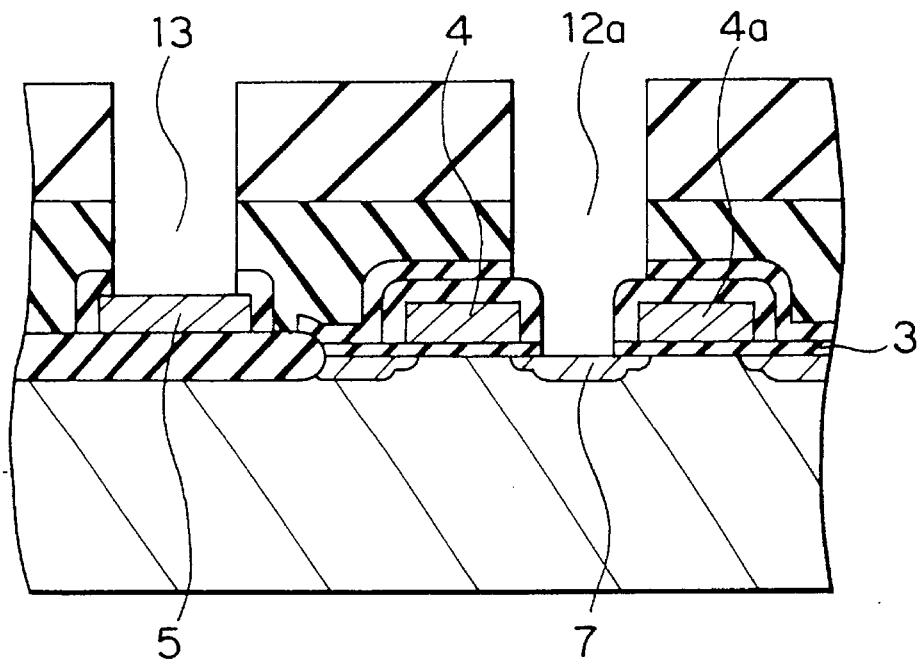

Next, as shown in FIG. 2E, the etch buffer insulation layer 8 in the contact hole portion 12a is selectively removed by etching. Furthermore, the thin oxide layer 3 is also removed by etching. The etching condition at this time is required to be varied depending upon the material to be etched. When the etching buffer layer 8 is removed by etching, a mixture gas of $CF_4$ and $O_2$ is employed as reaction gas. When the thin oxide layer 3 is to be removed by etching, a mixture of $CHF_6$ and CO is used as a reaction gas. As set forth above, by utilizing selectivity in dry etching, the respective insulation layer is removed through etching to expose the surface of the $n^+$ diffusion layer. Through these etching process, the surface of the first wiring layer 5 is substantially unetched.

As set forth above, the diffusion layer contact hole 12a and the wiring contact hole 13 are respectively formed in the surface of $n^+$ diffusion layer between opposing gate electrodes 4 and 4a and the first wiring layer 5.

Figure 2F:
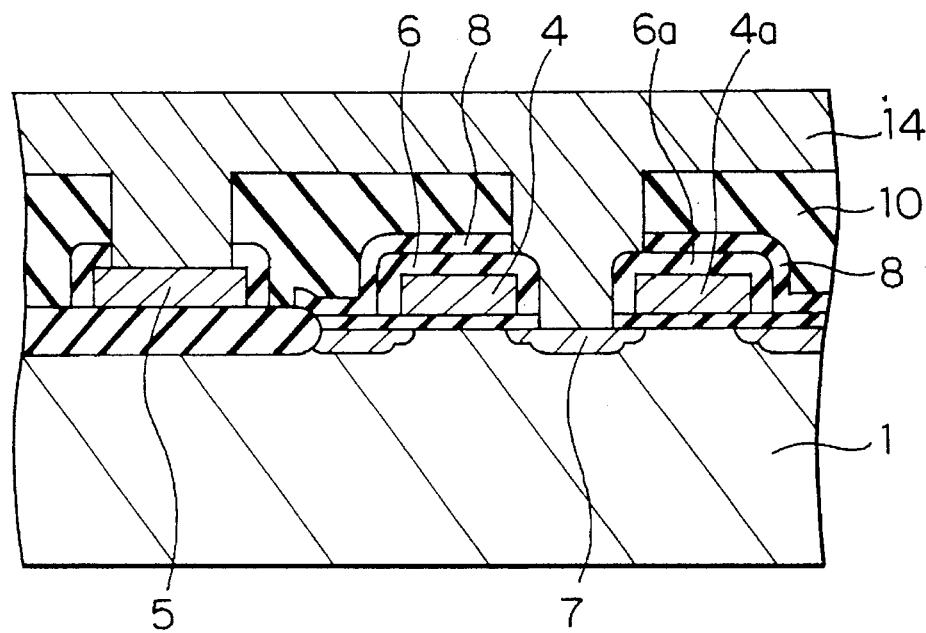

Next, as shown in FIG. 2F, a second wiring layer 14 is formed. Thus, the first wiring layer 5 and the $n^+$ diffusion layer 7 are electrically connected to the second wiring layer 14.

The etch buffer insulation layer resides after formation of the contact holes as a part of the intermediate insulation layer interposed between the gate electrodes 4 and 4a and the second wiring layer 14. Therefore, it is necessary to ascertain insulation ability of the SRO layer.

Figure 5:
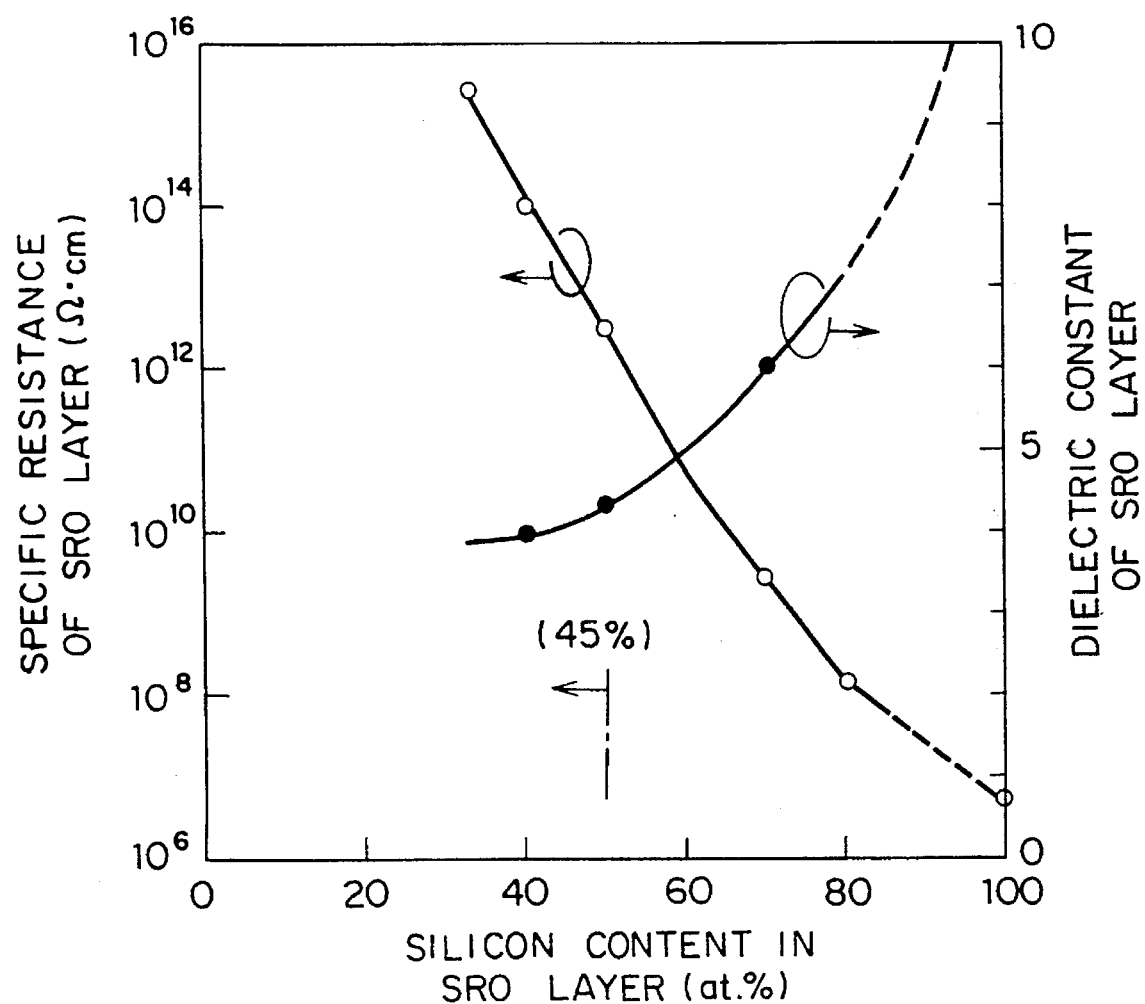
FIG. 5 is a graph showing insulation characteristics of the SRO layer to be employed in the shown embodiment.

FIG. 5 is a graph showing a relationship between a specific resistance and dielectric constant of the SRO layer and the excessive silicon amount in the SRO layer. Here, the layer thickness of the SRO layer is 100 nm, the specific resistance is the value when a charged electric field is low ($1 \times 10^6$ v/cm or less). The allowable leak current per each node in the semiconductor device designed with the dimensional standard of 0.25 µm is in the order of $10^{-18}$ Ampere. When the specific resistance is greater than or equal to $10^{12}$, the SRO layer may be satisfactorily adapted to the application as the intermediate insulation layer. In the case of the SRO layer, as can be clear from FIG. 5, this condition may be satisfied in the case where the silicon content of smaller than or equal to 45 at %. Here, as set out with respect to FIG. 4, considering the fact that the silicon content in the silicon dioxide layer is 33.3 at %, when the excessive silicon content in SRO layer is less than or equal to 12 at %, the above-mentioned condition can be satisfied. Also, with this range, the dielectric constant becomes less than or equal to 4.5 which is greater than that of silicon dioxide in the extent of about 10, and will cause no substantial problem.

As set forth, when the SRO layer is used as the etch buffer insulation layer, in view of the dry etching resistance (shown in FIG. 4) and insulation ability (shown in FIG. 5) of the layer set forth above, it should be understood that the SRO layer containing excessive silicon in the range of 2 to 12% in the silicon dioxide layer is preferred.

Next, the second embodiment of the present invention will be discussed with reference to FIGS. 6A to 6D. FIGS. 6A to 6D are cross sections showing the order of process in illustrating the semiconductor device fabrication process according to the second embodiment of the present invention.

Figure 6A:
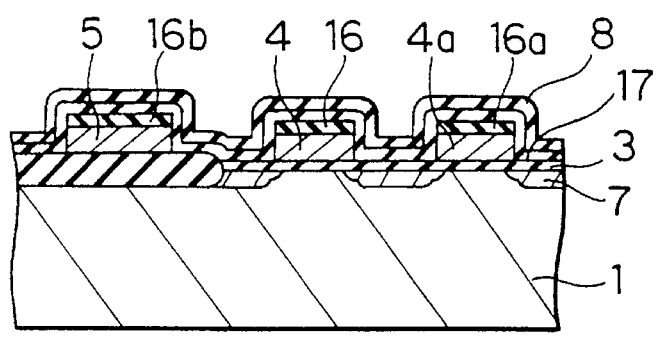
FIGS. 6A to 6D are sections showing a semiconductor device fabrication process according to the second embodiment of the invention.

At first, similarly to the first embodiment, as shown in FIG. 6A, a plurality of insulated-gate type field effect transistors and the first wiring layer 5 are formed on the surface of the semiconductor substrate. In this case, an upper layer insulation layer 16, 16a and 16b are formed over the gate electrodes 4 and 4a and the first wiring layer 5. Here, the upper layer insulation layer is formed with 100 to 200 nm of SRO layer. Thereafter, a first intermediate insulation layer 17 is deposited over the entire surface. The first intermediate insulation layer is formed with layer thickness 100 to 200 nm of a silicon dioxide layer. Thereafter, the etch buffer insulation layer 8 is formed over the surface of the first intermediate insulation layer in stacking manner.

Figure 6B:
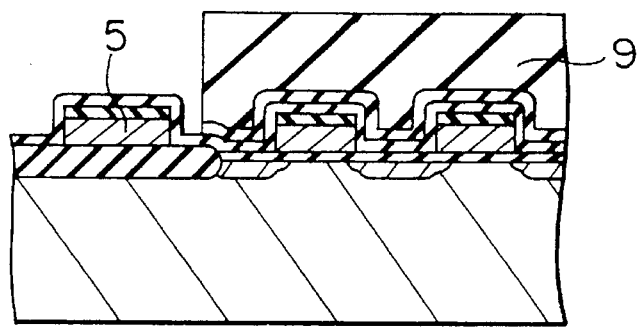

As shown in FIG. 6B, a photoresist 9 is patterned to form a mask. Then, the etch buffer insulation layer above the region of the first wiring layer 5 is removed by etching. Subsequently, the second intermediate insulation layer 10 is formed in the same manner to the first embodiment.

Figure 6C:
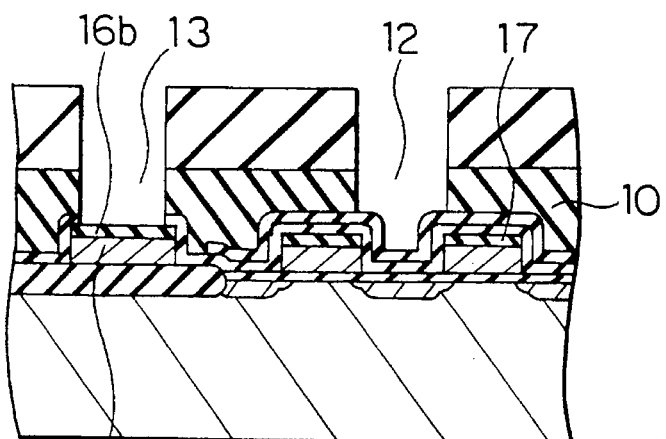

Also, after flattening, as shown in FIG. 6C, the diffusion layer contact hole 12 and the wiring contact hole 13 are formed through the second intermediate insulation layer 10. In this case, together with etch buffer insulation layer above the opposing gate electrodes, the upper layer insulation layer 16b above the first wiring layer 5 are maintained without being etched. As set forth above, the upper layer insulation layers 16, 16a and 16b are formed with the SRO layer similarly to the etch buffer insulation layer 8.

Then, the residual SRO layer 8 is removed by etching. An etching gas to be used in this process is preferred not to cause etching in the undercoated first intermediate insulation layer 17. As such gas, a mixture gas of $NF_3$ or $SF_6$ and $O_2$ may be used. Thus, the contact hole is formed on the first wiring layer 5.

Figure 6D:
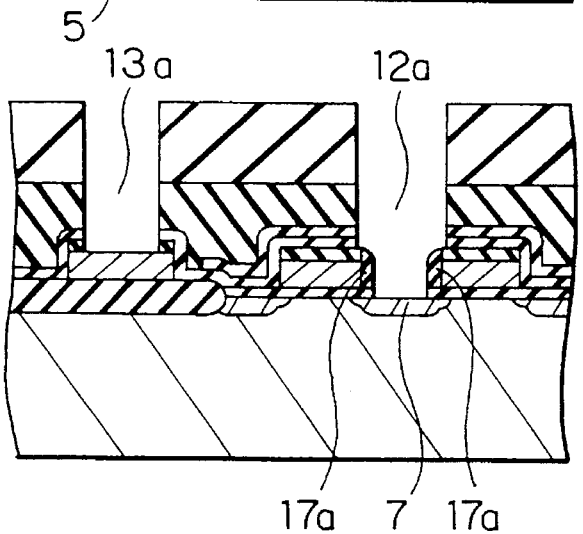

Next, as shown in FIG. 6D, dry etching is performed for the first intermediate insulation layer 17 between the opposing gate electrodes. In this process, the thin oxide layer 3 of the same material is simultaneously removed by etching to expose the surface of the n$^+$ diffusion layer 7 to form the contact hole. In the process of etching layer 17, an etching gas which is not effective for etching to the surface of the n$^+$ diffusion layer 7 and upper layer insulation layers 16 and 16a on the gate electrodes. As such gas, a mixture gas of $C_4H_8$ and CO or of $CHF_3$ and CO may be used. By this approach, a side wall insulation layer 17a is formed on the side wall of the gate electrode. As set forth above, an appropriate etching condition is selected to form the contact hole on the n$^+$ diffusion layer 7.

The foregoing are the process up to formation of the contact holes. The subsequent second wiring layer formation process is identical to the first embodiment.

Since the second embodiment permits simultaneous formation of the side wall insulation layer on the side wall of the gate electrode with formation of the contact hole, the number of overall process steps can be reduced in comparison with the first embodiment.

FIGS. 7A to 7D show cross sections showing the semiconductor device fabrication process according to the third embodiment of the present invention.

Figure 7A:
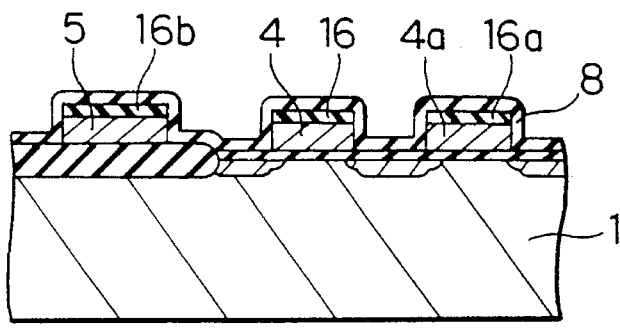
FIGS. 7A to 7D are sections showing a semiconductor device fabrication process according to the third embodiment of the invention.

In the shown embodiment, the process is substantially the same as that in the foregoing second embodiment. The shown embodiment is differentiated from the former second embodiment by forming the side wall insulation layer with the SRO layer which forms the etch buffer insulation layer. As shown in FIG. 7A, upper layer insulation layer 16, 16a and 16b are formed over the gate electrodes 4 and 4a of the insulated-gate type field effect transistor and the first wiring layer 5 on the surface of the silicon semiconductor device. This upper layer insulation layer is formed with a silicon dioxide layer in the layer thickness of 200 to 300 nm. Thereafter, etch buffer insulation layer 8 is deposited over entire surface.

Figure 7B:
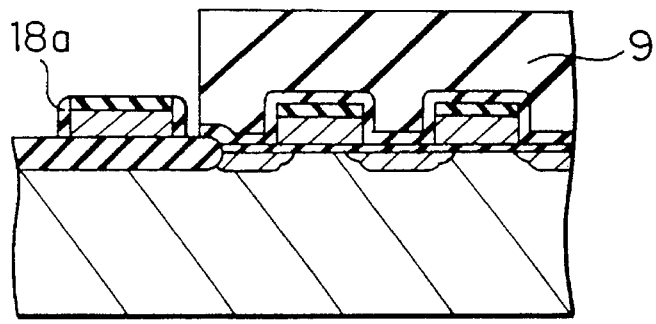

Next, as shown in FIG. 7B, with taking the photoresist 9 as a mask, etch buffer insulation layer 8 above the first wiring layer 5 is removed by etching. The etching is performed with enhancing anisotropic characteristics of etching. By this, the side wall insulation layer 18a can be formed on the side wall of the first wiring layer.

Figure 7C:
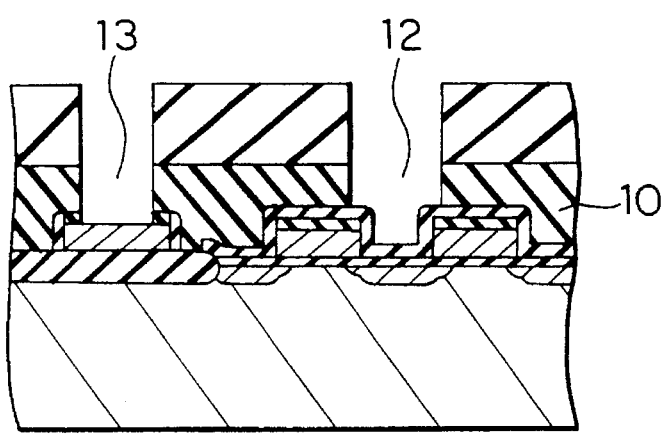
Figure 7D:
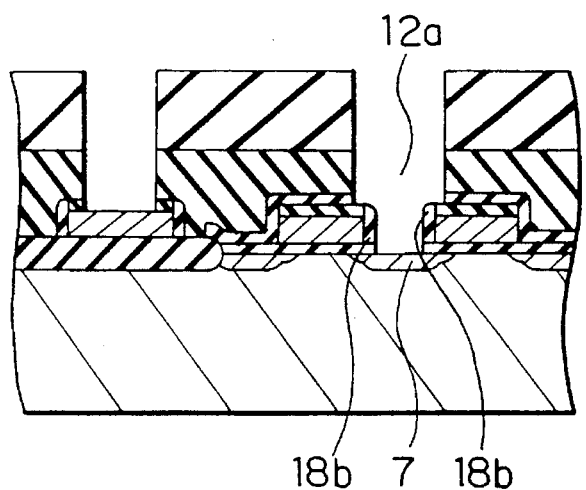

Next, after forming the second intermediate insulation layer 10, as shown in FIG. 7C, the diffusion layer contact hole 12 and the wiring contact hole 13 are formed in the second intermediate insulation layer 10. In this process, the portion above the second wiring layer 5 can be opened.

In order to completely open the gap between the opposing (adjacent) gate electrodes, the etching buffer insulation layer 8 at this portion is removed by anisotropic dry etching. As the etching gas, a mixture gas of $C_4F_8$ and CO which can selectively process the etch buffer insulation layer 8, is employed. By this, the upper insulation layer 16, 16a are maintained above the gate electrode, and in conjunction therewith, the side wall insulation layer 18b is formed on the side wall of the gate electrode. Finally, the thin oxide layer 3 is removed to open the n$^+$ diffusion layer 7.

In this case, since the SRO layer is used as the side wall insulation layer on the side wall of the gate electrode of the insulated-gate type field effect transistor, possibility of occurrence of inductive defect in the n⁺ diffusion layer due to thermal stress can be significantly reduced. This is because the thermal expansion coefficient becomes closer to the silicon substrate, since the SRO layer contains excessive amount of silicon in comparison with normally used silicon dioxide. Furthermore, in the third embodiment, overall process steps can be reduced in comparison with the second embodiment.

While the foregoing embodiments are discussed in detail in terms of the silicon oxide layer containing excess amount of silicon as the etch buffer insulation layer, other applications may be encompassed in the scope of the invention. For instance, as one modification of the third embodiment, it is possible to employ inert SRO layer for the upper layer insulation layer 16, 16a and 16b, and the silicon dioxide layer is employed for forming the etch buffer insulation layer. In either case, in the insulation layer to be the intermediate insulation layer between the gate electrode wiring and the second wiring layer, the silicon oxide layer containing excessive silicon is used.

Although the invention has been illustrated and described with respect to exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out above but to include all possible embodiments which can be embodies within a scope encompassed and equivalents thereof with respect to the feature set out in the appended claims.

What is claimed is:

1. A process for forming a semiconductor device with a wiring structure, comprising the steps of:
   (a) providing a semiconductor substrate, adjacent gate electrodes formed on said semiconductor substrate and said gate electrodes defining a gap therebetween, and a diffusion layer formed in a surface of said semiconductor substrate at a location beneath said gap;
   (b) providing a first wiring layer on said semiconductor substrate;
   (c) forming a first insulation layer covering said first wiring layer and said gate electrodes;
   (d) forming an etch buffer insulation layer on said first insulation layer and in said gap;
   (e) removing a part of said etch buffer insulation layer where located above said first wiring layer to expose a portion of said first insulation layer located above said first wiring layer;
   (f) forming a second insulation layer on nonremoved parts of said etch buffer insulation layer remaining after step (e) and on said exposed portion of said first insulation layer;
   (g) performing etching to remove first portions of each of said first insulation layer and said second insulation layer located above said first wiring layer to form a wiring contact hole while simultaneously removing a second portion of said second insulation layer where located above said diffusion layer and at said gap between said gate electrodes to form a diffusion layer contact hole extending through said second insulation layer into contact with said etch buffer insulation layer;
   (h) performing etching to remove said etch buffer insulation layer where located above said diffusion layer; and
   (i) forming a second wiring layer filling in said wiring contact hole and said diffusion layer contact hole.

2. A process for forming a semiconductor device with a wiring structure according to claim 1, wherein said etch buffer insulation layer comprises a silicon rich oxide (SRO) layer.

3. A process for forming a semiconductor device with a wiring structure according to claim 2, wherein said silicon rich oxide layer comprises a silicon content of 35 at % to 45 at %.

4. A process for forming a semiconductor device with a wiring structure according to claim 1, wherein said etching of step (g) comprises dry etching, and said etch buffer insulation layer has a slower rate of etching than both said first insulation layer and said second insulation layer during step (g).

5. A process for forming a semiconductor device with a wiring structure according to claim 4, wherein, in said etching of step (g), the ratio of the etch rate of said first insulation layer to the etch rate of said etch buffer insulation layer is a value of 15 or greater, and wherein the ratio of the etch rate of said second insulation layer to the etch rate of said etch buffer insulation layer is a value of 15 or greater.

6. A process for forming a semiconductor device with a wiring structure according to claim 4, wherein said dry etching comprises reactive ion etching based on a reaction gas of $C_4F_8$ and CO.

7. A process for forming a semiconductor device with a wiring structure according to claim 1, wherein said first insulation layer comprises silicon dioxide, said second insulation layer comprises silicon dioxide, and said etching buffer insulation layer comprises silicon rich oxide.

8. A process for forming a semiconductor device with a wiring structure according to claim 1, wherein said etching to remove said etch buffer insulation layer located above said diffusion layer etching in step (h) comprises dry etching with a reactive gas based on $CF_4$ and $O_2$.

9. A process for forming a semiconductor device with a wiring structure according to claim 1, wherein said etching in step (g) to remove first portions of each of said first insulation layer and said second insulation layer located above said first wiring layer to form said wiring contact hole exposes an upper surface of said first wiring layer.

10. A process for forming a semiconductor device with a wiring structure, comprising the steps of:
   (a) providing a semiconductor substrate, adjacent gate electrodes having upraised first and second top surfaces, respectively, formed on said semiconductor substrate and said gate electrodes defining a gap therebetween, and a diffusion layer formed in a surface of said semiconductor substrate at a location beneath said gap;
   (b) providing a first wiring layer having an upraised top surface on said semiconductor substrate;
   (c) forming a first silicon rich oxide layer only on said first and second top surfaces of said gate electrodes and said top surface of said first wiring layer;
   (d) forming a first insulation layer covering said first silicon rich oxide layer, said first wiring layer, said gate electrodes, and in said gap;
   (e) forming an etch buffer insulation layer on said first insulation layer and in said gap;
   (f) removing a part of said etch buffer insulation layer where located above said first wiring layer to expose a portion of said first insulation layer located above said first wiring layer;
   (g) forming a second insulation layer on nonremoved parts of said etch buffer insulation layer remaining after step (f) and on said exposed portion of said first insulation layer;

(h) performing etching to remove first portions of each of said first insulation layer and said second insulation layer located above said first wiring layer to form a wiring contact hole while simultaneously removing a second portion of said second insulation layer where located above said diffusion layer and at said gap between said gate electrodes to form a diffusion layer contact hole extending through said second insulation layer into contact with said etch buffer insulation layer;

(i) performing etching to remove said etch buffer insulation layer where located above said diffusion layer;

(j) performing etching to remove a portion of said first insulation layer located in said gap and above said diffusion layer; and (k) forming a second wiring layer filling in said wiring contact hole and said diffusion layer contact hole.

11. A process for forming a semiconductor device with a wiring structure according to claim 10, wherein said etch buffer insulation layer comprises a silicon rich oxide (SRO) layer.

12. A process for forming a semiconductor device with a wiring structure according to claim 11, wherein said silicon rich oxide layer comprises a silicon content of 35 at % to 45 at %.

13. A process for forming a semiconductor device with a wiring structure according to claim 10, wherein said etching of step (h) comprises dry etching, and said etch buffer insulation layer has a slower rate of etching than both said first insulation layer and said second insulation layer during step (h).

14. A process for forming a semiconductor device with a wiring structure according to claim 13, wherein, in said etching of step (h), the ratio of the etch rate of said first insulation layer to the etch rate of said etch buffer insulation layer is a value of 15 or greater, and wherein the ratio of the etch rate of said second insulation layer to the etch rate of said etch buffer insulation layer is a value of 15 or greater.

15. A process for forming a semiconductor device with a wiring structure according to claim 13, wherein said dry etching comprises reactive ion etching based on a reaction gas of $C_4F_8$ and CO.

16. A process for forming a semiconductor device with a wiring structure according to claim 10, wherein said first insulation layer comprises silicon dioxide, said second insulation layer comprises silicon dioxide, and said etching buffer insulation layer comprises silicon rich oxide.

17. A process for forming a semiconductor device with a wiring structure according to claim 12, wherein said etching to remove said etch buffer insulation layer located above said diffusion layer etching in step (i) comprises dry etching with a reactive gas based on $O_2$ and one of $NF_3$ and $SF_6$.

18. A process for forming a semiconductor device with a wiring structure according to claim 10, wherein said etching to remove said portion of said first insulation layer in said gap and located above said diffusion layer in step (j) comprises dry etching.

19. A process for forming a semiconductor device with a wiring structure according to claim 18, wherein said etching to remove said portion of said first insulation layer in step (j) exposes an upper surface of said diffusion layer.

20. A process for forming a semiconductor device with a wiring structure according to claim 18, wherein said etching to remove said portion of said first insulation layer in step (j) extends said diffusion layer contact hole to an upper surface of said diffusion layer while leaving portions of said first insulation layer as sidewall insulation layers on sidewalls of said gate electrodes.

* * * * *